(12) United States Patent
May et al.

(10) Patent No.: US 6,693,668 B1
(45) Date of Patent: Feb. 17, 2004

(54) SELF-DIAGNOSTIC IMAGE SENSOR

(75) Inventors: Gerald A. May, Saratoga, CA (US); Harry T. Garland, Los Altos, CA (US)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/327,366

(22) Filed: Jun. 4, 1999

(51) Int. Cl.[7] .............................................. H04N 9/64
(52) U.S. Cl. ...................................... 348/247; 382/275
(58) Field of Search ................................. 348/246, 247, 348/251, 222.1; 378/62, 98, 98.8, 98.5, 98.12; 382/145, 149, 132, 141, 275, 284

(56) References Cited

U.S. PATENT DOCUMENTS

| | | | | |
|---|---|---|---|---|
| 4,602,291 A | * | 7/1986 | Temes | 348/247 |
| 4,654,714 A | * | 3/1987 | Hurst, Jr. et al. | 348/246 |
| 4,805,023 A | * | 2/1989 | Younse et al. | 348/247 |
| 5,436,659 A | * | 7/1995 | Vincent | 348/246 |
| 5,970,115 A | * | 10/1999 | Colbeth et al. | 378/62 |
| 6,118,846 A | * | 9/2000 | Liu | 378/62 |
| 6,198,800 B1 | * | 3/2001 | Garland et al. | 378/98.8 |
| 6,201,249 B1 | * | 3/2001 | Yamayoshi | 250/370.09 |
| 6,381,357 B1 | * | 4/2002 | Tan et al. | 348/246 |
| 6,396,539 B1 | * | 5/2002 | Heller et al. | 348/246 |
| 6,535,648 B1 | * | 3/2003 | Acharya | 382/274 |

* cited by examiner

*Primary Examiner*—Aung S. Moe
(74) *Attorney, Agent, or Firm*—Fitzpatrick, Cella, Harper & Scinto

(57) ABSTRACT

A self-diagnosing image sensor (100) detects and stores maps of functioning and malfunctioning pixels (124) in a memory (144) directly coupled to the sensor (100). The memory (144) is coupled to an external monitoring computer (118) which retrieves the pixel map and adjusts the sensor data received from the image sensor (100) in accordance with the retrieved pixel map. A defect discriminator (140) is coupled directly to the image sensor (100) and to the memory (144) for detecting whether a pixel (124) malfunctions, and updates the map accordingly. Additionally, if the number of malfunctioning pixels (124) in the sensor (100) exceeds a predefined threshold, an alert message is available to the external monitoring computer or display (118) to warn the user that the sensor (100) may be generating inaccurate information. An on-plate pixel processor (148) performs any necessary interpolation of the date responsive to the pixel map, and a complete image is sent to the remote display (118), without requiring any further processing.

13 Claims, 10 Drawing Sheets

SELF-DIAGNOSTIC IMAGE SENSOR

TECHNICAL FIELD

The present invention relates generally to the field of digital image sensors.

BACKGROUND OF THE INVENTION

Digital image sensors are used in a wide variety of applications. In some applications, images produced by these sensors are used to make critical decisions, such as in medical imaging applications where accurate image renditions can be crucial to the process of making diagnoses. The image sensors are typically composed of millions of photo-sensitive cells or pixels which transform light received into the cells into voltage output. The conversion of light to electrical signals is determined by a transfer characteristic, and each cell typically has its own transfer characteristic. The output of the image sensor, therefore, are a series of electrical pulses, each of which represents the reading of an individual cell. A processor receives the electrical pulses and converts the data into a digital representation of the image, which is then stored on a disk from which it can be displayed, archived, or printed out on a printer.

Due to manufacturing defects, a new image sensor plate may have many individual pixels malfunction, and occasionally may even have an entire column malfunction which contains thousands of pixels. However, even with these defects, a sensor plate can still record an accurate, smooth, representation of a subject. This is accomplished by interpolating the data for the malfunctioning pixels from the surrounding functioning pixels. Although this technique is effective, critical information may be lost if the interpolation process is applied to a large number of pixels or a group of pixels in a cluster. For example, in a medical application, the interpolated data may obscure actual data critical to an accurate diagnosis.

A recurring problem in the use of conventional image sensors is the re-configuration of the computer system that is required each time a new image sensor is installed. In order to interpolate around the defective pixels, the computer system must be able to access the defect information for a plate. Thus, each time a plate is removed, a technician must install the defect map for the replacement plate into the computer system. Installing the defect map is time-consuming, burdensome, and leads to erroneous images if not properly completed at the time when the replacement image sensor plate is installed. Additionally, when a pixel becomes defective after leaving the manufacturing site, the only method to detect a malfunction is to manually calibrate the plate. Manual calibration is also a burdensome, error-prone process which increases the overall cost of using an image sensor plate. Therefore, there is needed an image-sensing device that is capable of being replaced without having to update an associated computer system, which is able to detect whether a pixel located within the sensor plate has become defective or whether an increasing number of pixels are failing, and respond accordingly. Additionally, there is a need for a plate which can alert a user to discontinue use of the sensor when the number or configuration of malfunction pixels indicates that the interpolation process is no longer appropriate.

DISCLOSURE OF INVENTION

In a preferred embodiment, a self-diagnosing image sensor (100) stores maps of functioning and malfunctioning pixels (124) or clusters of such pixels in a memory (144) directly coupled to the image sensor (100). The memory (144) is coupled to an external monitoring computer (118) which retrieves the pixel map and adjusts the sensor data received from the image sensor (100) in accordance with the retrieved pixel map. In a further embodiment, a defect discriminator (140) is coupled directly to the image sensor (100) and the memory (144), detects whether a pixel (124) malfunctions, and updates the map accordingly. In this embodiment, multiple versions of the map generated at different times are stored in the memory (144) to provide a diagnostic history of the plate (100). Additionally, if the number of malfunctioning pixels (124) in the map exceeds a predefined threshold, an alert message is transmitted to the external monitoring computer or display (118) to warn the user that the sensor (100) may be generating inaccurate information. Alternatively, the image sensor (100) compares a newly generated map with a previous version of the map. If there are any changes, the user is notified. The external monitoring computer (118) may also request status information regarding the pixels from the image sensor (100) at any time. Finally, an on-plate pixel processor (148) is coupled to the memory (144) to generate interpolated data. In this embodiment, the external monitoring computer (118) need only display the interpolated image; no further processing is required outside of the plate (100).

DETAILED DESCRIPTION OF THE PREFERRED EMBODIMENTS

Figure 1:
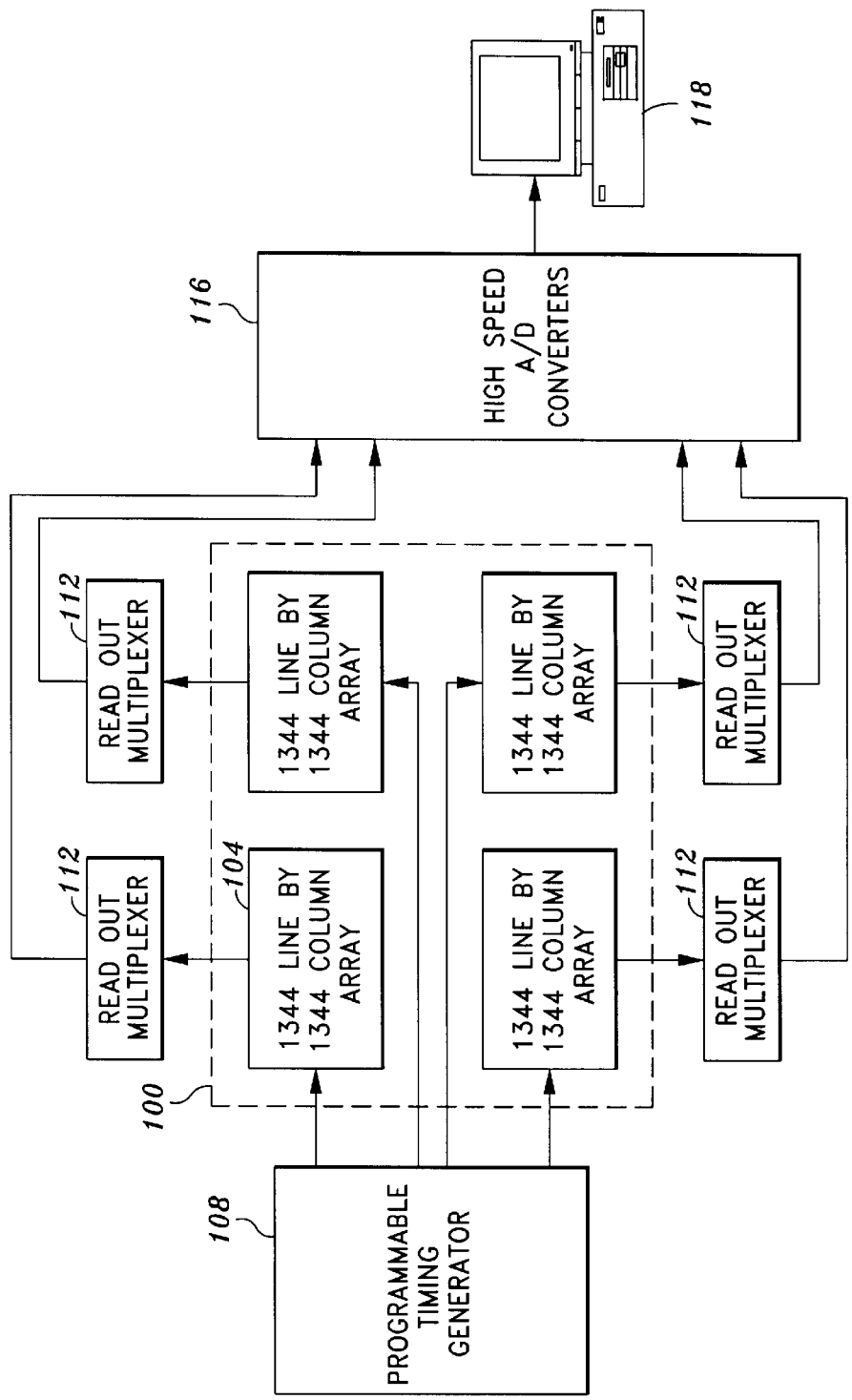
FIG. 1 illustrates an overview of a digital image processing system.

FIG. 1 illustrates an overview of a digital image processing system. A programmable timing generator 108 is coupled to an image sensor 100. The programmable timing generator 108 generates timing signals which sample the different rows and columns of the image sensor 100. Programmable timing generator 108 is preferably a computer coupled to a random access programmable timer 120.

Image sensor 100 is preferably a large area amorphous silicon detector. The image sensor 100 is made up of four smaller panels 104 abutted together, and has a total size of 17" by 17". Each panel 104 holds approximately one million photosensitive sites 124, or pixels 124 in a 1344 row by 1344 column array 104. Other image sensors of differing sizes, configurations, and having different numbers of pixels 124 may also be used in accordance with the present invention. Additionally, the image sensor may be constructed with a scintillator layer to detect X-rays and convert the X-rays into light.

Each panel 104 is coupled to a read out multiplexer 112 which transmits the analog signals transmitted by the pixels 124 to high speed analog-to-digital (A/D) converters 116. The read out multiplexer 112 is a conventional multiplexer as is known to one of ordinary skill in the art. The A/D converters 116 convert the analog electrical signals into digital signals. The A/D converters are conventional converters used in the art. The digital signals are transmitted to a external monitoring computer 118 which then stores the digital sensor data for display.

Figure 2:
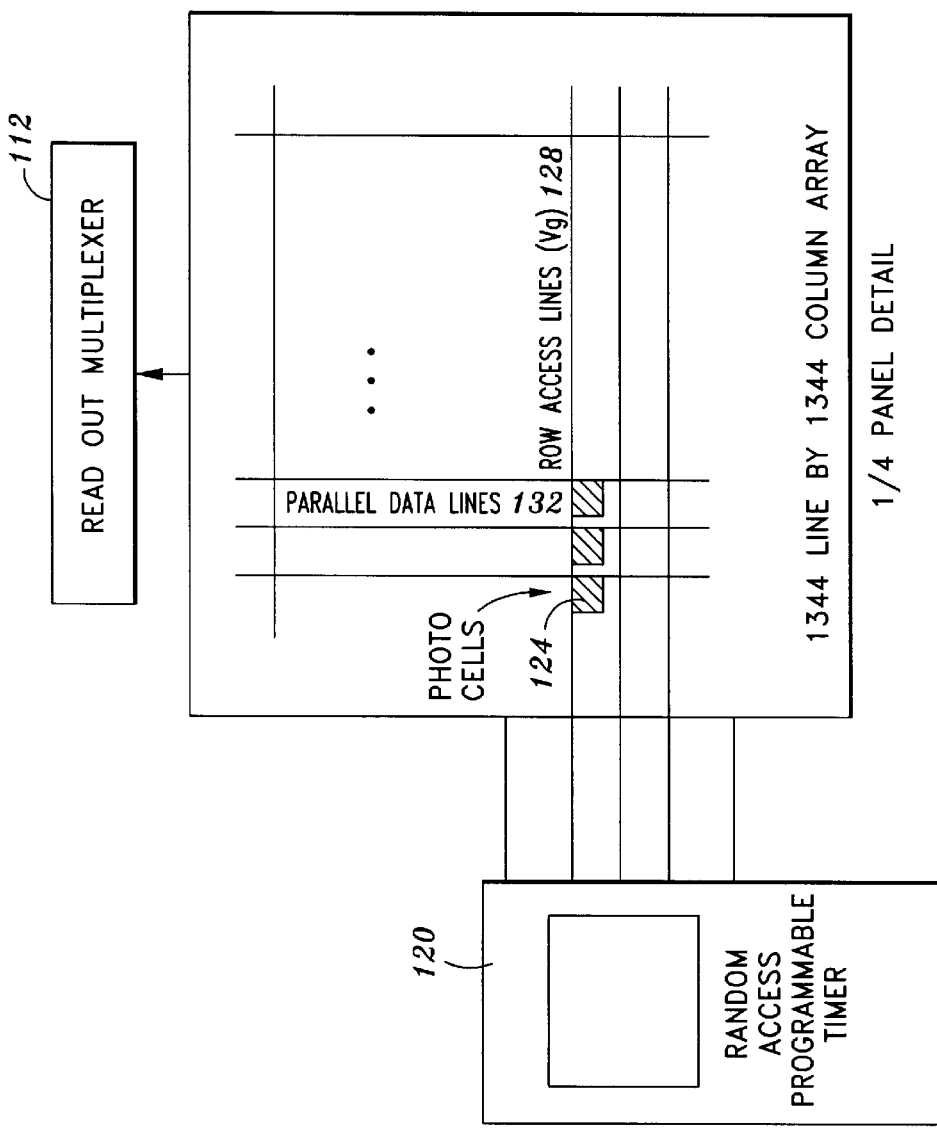
FIG. 2 is a block diagram illustrating the functioning of an image sensor 100.

FIG. 2 illustrates the processing of image sensor 100. The image sensor 100 is composed of three layers: a protective layer, a scintillator layer, and an amorphous silicon layer (not shown). The protective layer protects the other layers from damage. The scintillator converts x-rays into electromagnetic radiation, typically in the visible light spectrum. The light 303 is transmitted to the amorphous silicon layer 302.4, which then produces a corresponding output voltage, described in more detail with reference to FIG. 3a.

The image sensor 100 includes an array of sensor unit pixels 124 for measuring levels of light exposure and for capturing images. The random access programmable timer is coupled to every row in each panel 104. At the intersection of each row and column is a pixel 124. A pixel 124 converts light energy into electrical energy in accordance with a transfer characteristic of the pixel. Each row is selected and each column is then sampled to obtain the voltages present at each pixel 124 in the row. The voltages are transmitted to the read out multiplexer 112.

Figure 3A:
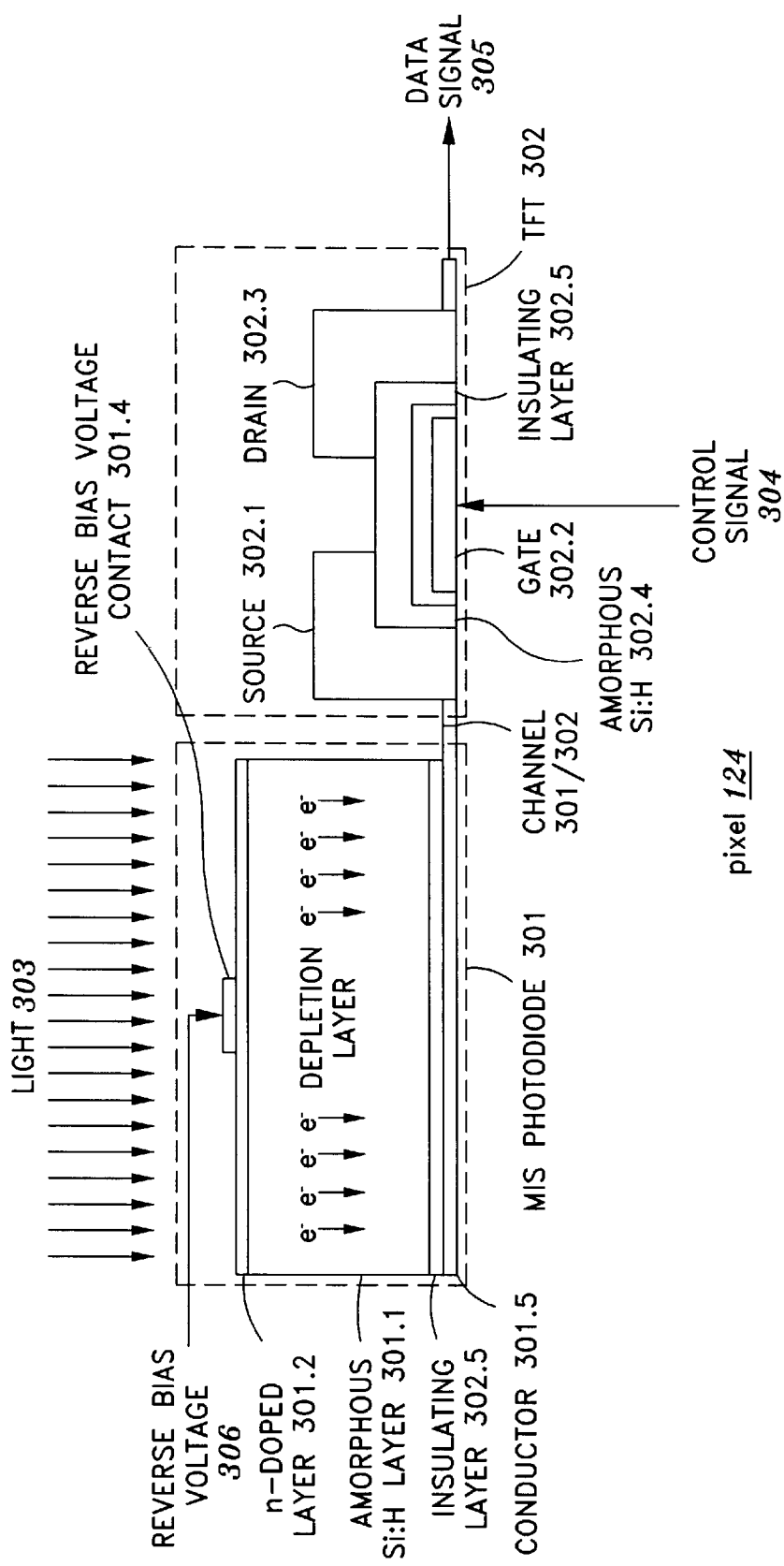
FIG. 3a is a cross-sectional view of a pixel 124.

FIG. 3a illustrates a cross section of a pixel 124 in accordance with the present invention. A pixel 124 is preferably a metal-insulator-semiconductor (MIS) structure comprising a layer of amorphous silicon in between outer layers of metal and doped silicon. Shown in FIG. 3a is a cross section of photoelectric sensor pixel 124 in accordance with the present invention. Pixel 124 comprises MIS photodiode 301 connected to field effect/thin film transistor (TFT) 302 by channel 301/302. In operation, an electromagnetic field, such as light 303, strikes MIS photodiode 301, which produces and stores an amount of electrical charge proportional to the amount of impinging light 303. After a predetermined period of time has expired, control signal 304 instructs TFT 302 to allow the accumulated electrical charge to pass from the pixel 124 as data signal 305.

MIS photodiode 301 comprises a layer of intrinsic hydrogenated amorphous silicon (a-Si:H) 301.1 sandwiched between a layer of n-doped a-Si:H 301.2 and insulating layer 301.3. Photodiode 301 is operative when positioned with the n-doped layer facing the light 303. In addition to the sandwiched layers of amorphous silicon, photodiode 301 comprises a reverse bias voltage contact 301.4 positioned between the n-doped layer and the scintillator, and a layer of electrical conductor 301.5 positioned under the insulating layer 302.5 and leading to source 302.1 of TFT 302. In one embodiment of the invention, conductor 301.5 is comprised of chromium.

Figure 4A:
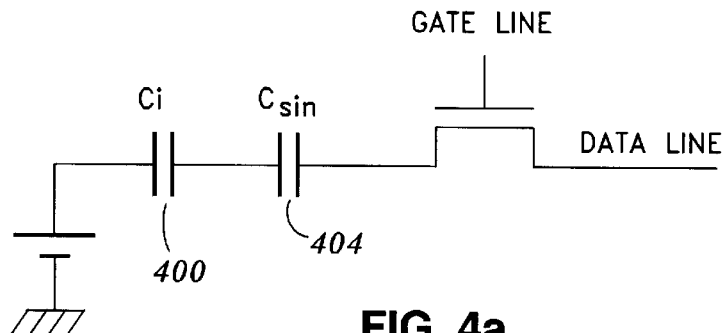
FIG. 4a is an equivalent circuit of a pixel in accumulation mode.

The dynamic range of the MIS photodiode 301 is limited by pixel noise and saturation. The saturation is the maximum amount of charge that can be stored on each photodiode 301. FIG. 4a shows the equivalent circuit of a pixel 124 in photoelectric accumulation mode. It is equivalent to two capacitors $C_i$ 400, $C_{sin}$ 404 in series.

TFT 302 comprises source 302.1, gate 302.2, and drain 302.3. Channel 302.4 (comprised of a-Si:H) and a layer of insulating material 302.5 are positioned between the source and gate, and between the gate and drain. Control signal 304 is received by the pixel 124 on gate 302.2, while data signal 305 is read from the pixel 124 on drain 302.3. When control signal 304 is at a negative voltage, channel 302.4 is pinched off, preventing the electrons collected on conductor 301.5 from escaping. As control signal 304 approaches a neutral voltage, the channel opens and allows the trapped electrons to pass through the TFT as data signal 305. The pixels 124 are typically coupled in horizontal rows via their gates 302.2, and are coupled in vertical rows through their drains 302.3, as shown in FIG. 4b.

Figure 3B:
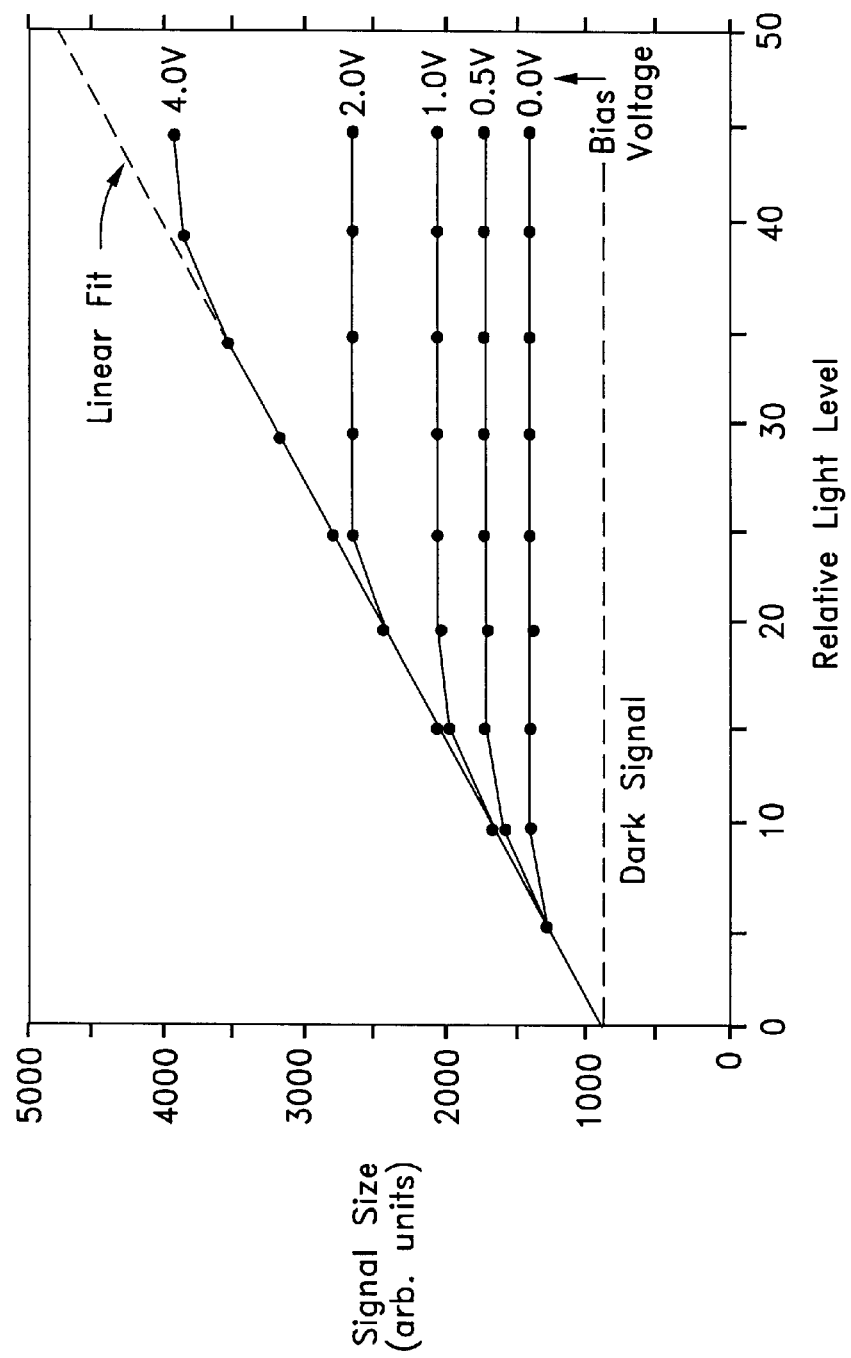
FIG. 3b illustrates an exemplary transfer characteristic of a pixel 124.

FIG. 3b illustrates a typical transfer characteristics of a pixel 124 in accordance with the present invention. As can be seen, as the light level is increased, the voltage across the pixel decreases, and the signal size, which is inversely proportional to the voltage level, increases. The signal size increases until saturation, at which time the charge in the pixel has been completely depleted. The pixels 124 may be any type of conventional pixel designed for use in medical imaging.

Figure 4B:
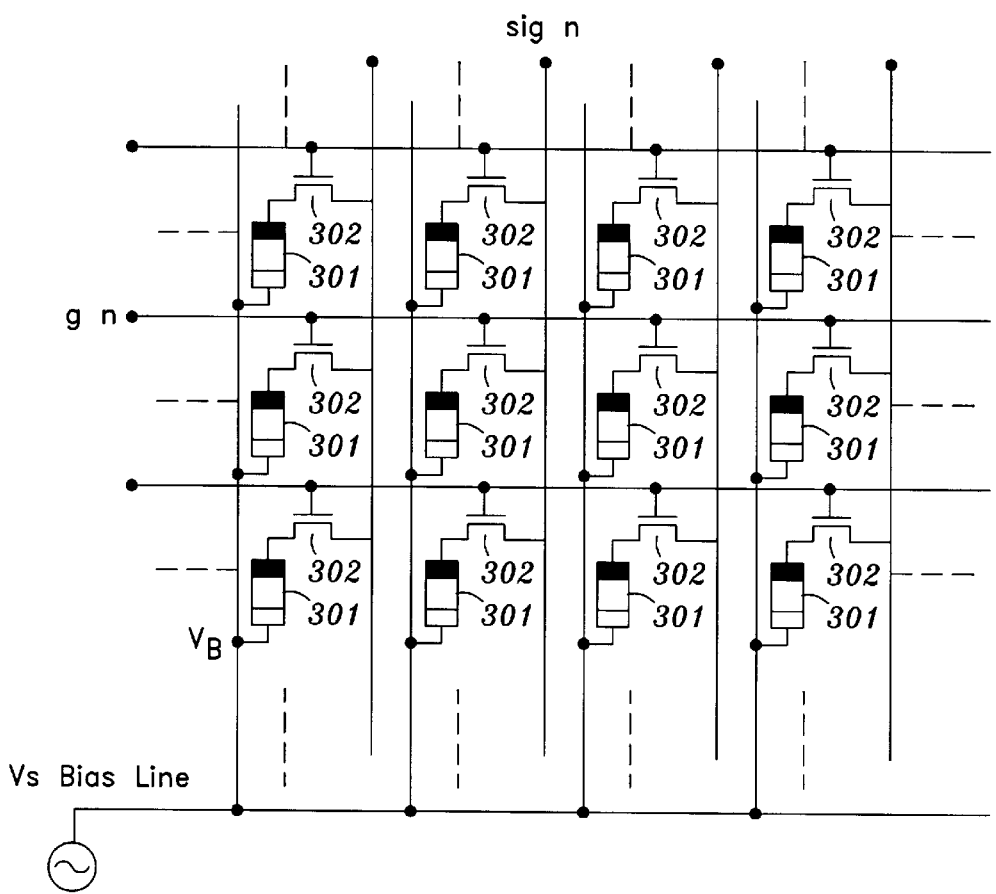
FIG. 4b illustrates a block diagram of the components of image sensor 100.
Figure 5A:
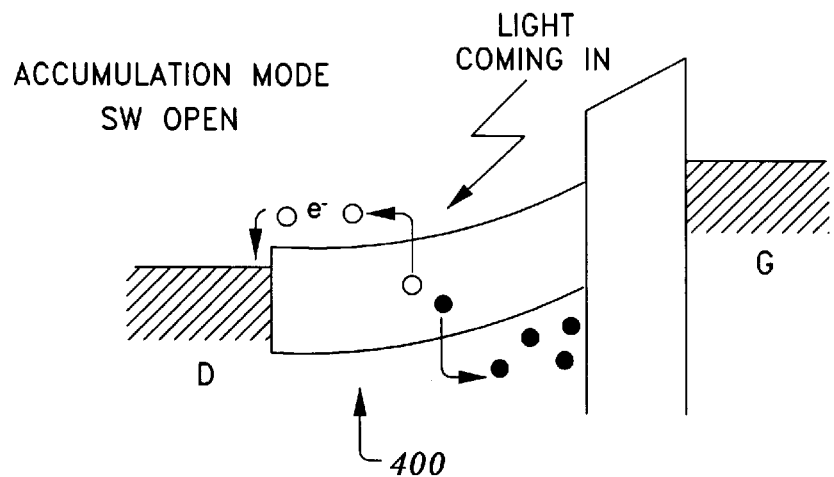
FIG. 5a illustrates the operation of image sensor 100 in accumulation mode.
Figure 5B:
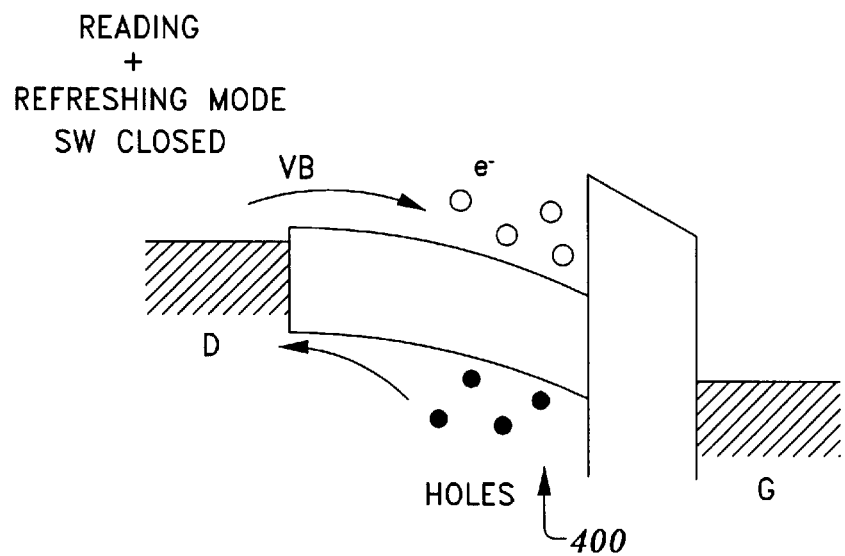
FIG. 5b illustrates the operation of image sensor 100 in read and refresh mode.

FIG. 4b illustrates a representative schematic of pixels 124 in an image sensor 100. As described above, the sources 302.1 of the TFTs 302 are connected to the photodiode 301. The drains 302.3 of the TFTs 302 are connected in columns to form the data lines. The gates 302.2 of the TFTs 302 are connected in rows to form the gate lines. The network of bias lines is connected to the photodiodes 301 to allow a reverse bias to be applied across each photodiode 301. There are two operations performed by the image sensor 100: accumulation mode and read and refresh mode. As shown in FIG. 5a, in accumulation mode, light 303 strikes the silicon, and the valence electrons of the silicon atoms are excited into the conduction band, thereby creating electron-hole pairs. As shown in FIG. 5b, in read and refresh mode, a positive bias voltage (VS) is applied to the bias line to reverse bias the photodiode 301. The electrons and holes are swept out of the amorphous silicon to form a depletion layer, and thus discharge the photodiode capacitance in proportion to the light intensity.

Once the charges are produced by the pixels 124 in response to the light 303 received from the scintillator layer in the accumulation mode, the voltage present at the pixels 124 is read out in the read and refresh mode on a row-by-row basis and converted to digital quantities. The digital values may then be used in producing an image or in measuring an exposure level. The read out is performed by bringing a single TFT gate row to a positive potential which renders all of the TFTs 302 along the row conducting. The amount of charge left on the photodiodes 301 causes a current to flow into the data lines which is detected by the data line preamplifiers, one preamplifier per data line. In this readout scheme, measurement of the pixels also initializes them.

Figure 6:
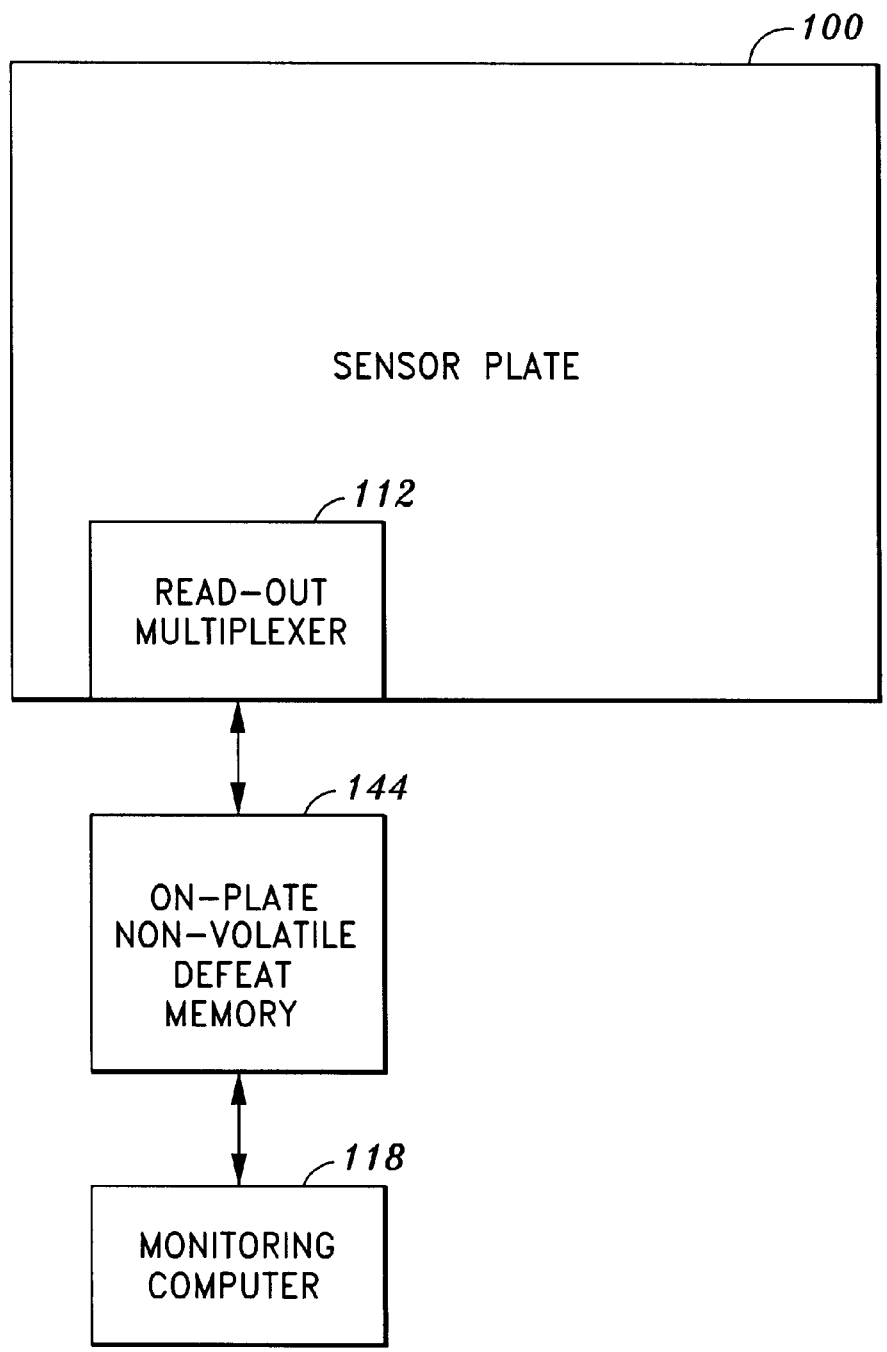
FIG. 6 is a block diagram illustrating an image sensor 100 coupled to a memory 144 in accordance with the present invention.

FIG. 6 illustrates a preferred embodiment of the sensor plate 100 in accordance with the present invention. A memory device 144 is coupled to the sensor plate 100. The memory device 144 is also coupled to external monitoring computer 118. The memory device 144 stores a map of the location of the pixels 124, and for each pixel 124 indicates whether the pixel 124 generates a voltage for an input which exceeds a predefined threshold voltage for that input. This map is preferably stored into memory 144 at the time of manufacture, at which time all pixels 124 on a plate 100 are typically tested for functionality. The computer 118 retrieves the map from the memory 144 in order to process the electrical data transmitted by the read out multiplexer 112. As described above, the computer 118 uses this data to interpolate data for the malfunctioning pixels; i.e., the pixels 124 that do not generate voltages which exceed the required amount for a given input.

Figure 7:
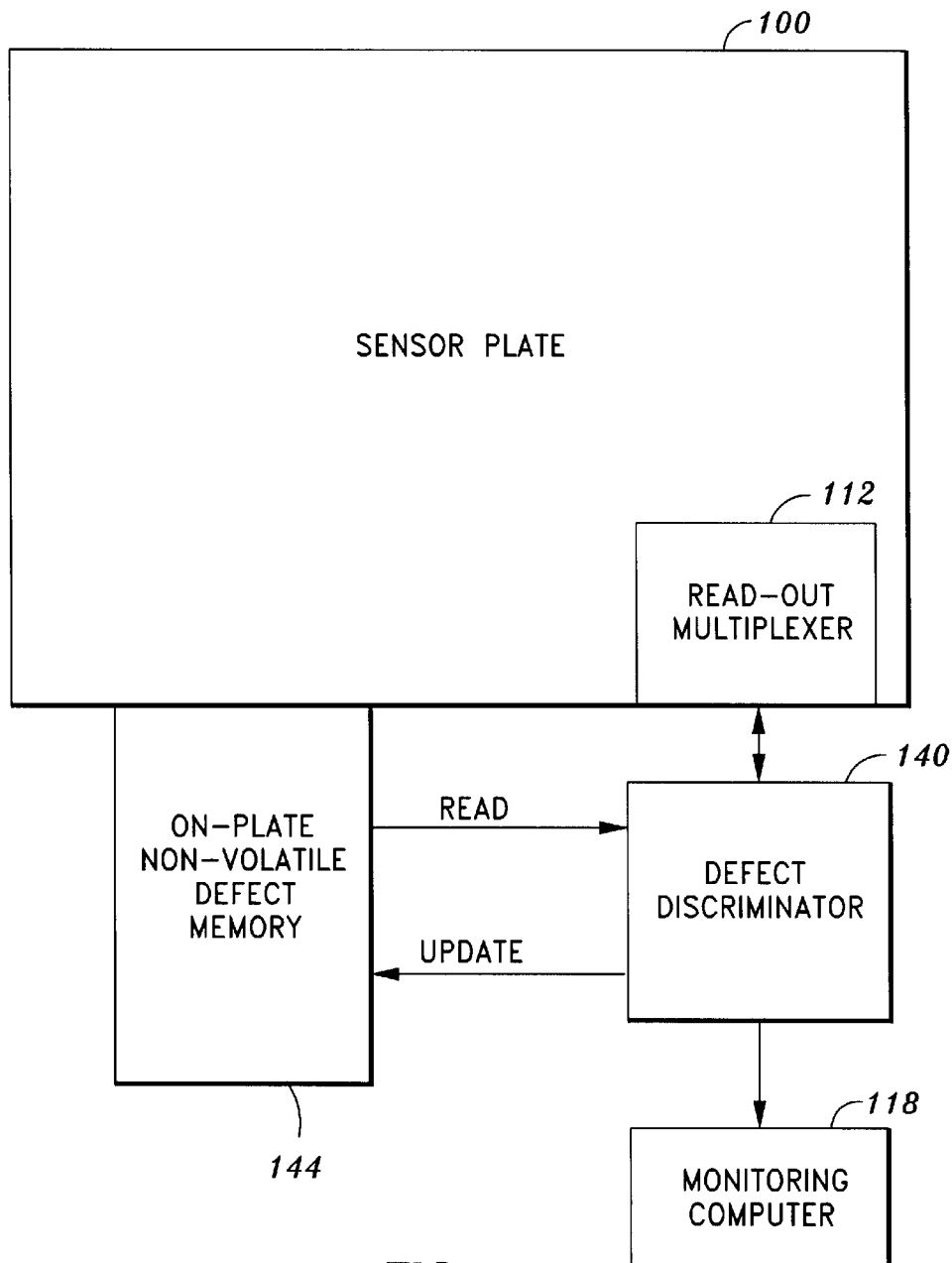
FIG. 7 is a block diagram illustrating an alternate embodiment of image sensor 100 having a defect discriminator 140 in accordance with the present invention.

FIG. 7 illustrates an alternate embodiment of the present invention. In this embodiment, a defect discriminator 140 is coupled to the sensor plate 100 to receive the voltages transmitted by the read out multiplexer 112. The defect discriminator 140 is also coupled to the memory 144 for updating the stored pixel map. In this embodiment, the defect discriminator 140 is coupled to the computer 118 for transmitting the stored map to the computer 118.

The defect discriminator 140 detects whether a pixel 124 has become malfunctioning. This is accomplished by biasing the pixels 124 to an initial voltage, V1 using a bias line VS. The output of the pixels 124 is then read in the read and refresh mode. Next the pixels 124 are biased to a second voltage, V2. The output of the pixels 124 is read again. If a pixel 124 is malfunctioning, V1 will equal V2. In response to determining that a pixel 124 is newly malfunctioning, the stored map of malfunctioning pixels 124 is updated to indicate the status of the non-functioning pixel 124. Each time a calibration is executed by the defect discriminator 140, the pixel map is stored in memory 144 to provide a history of the plate 100. The maps are preferably given a time/date stamp to identify the data. Thus, a user can retrieve a history of the pixel functioning of a plate 100 at any time to diagnose any problems with the plate 100 simply by initiating a request for the data from the external monitoring computer 118. The request is transmitted to the defect discriminator 140, which retrieves the data from the memory 144, and transmits the data to the external monitoring computer 118. As the history data is stored on-plate, the analysis of the data can be performed in the lab where the plate 100 is stored, at the manufacturer's site, or at an independent third party site.

The calibration or self-test of the pixel functioning of the plate 100 may be performed upon power-up or may be initiated by an external trigger. By advantageously detecting malfunctioning pixels 124 without requiring the use of test images or light 303, the map is updated by the plate 100 independent of user participation. Alternatively, an external trigger allows the user to immediately obtain a diagnostic of the plate 100, allowing the user to verify the accuracy of a recently-taken image.

Figure 8:
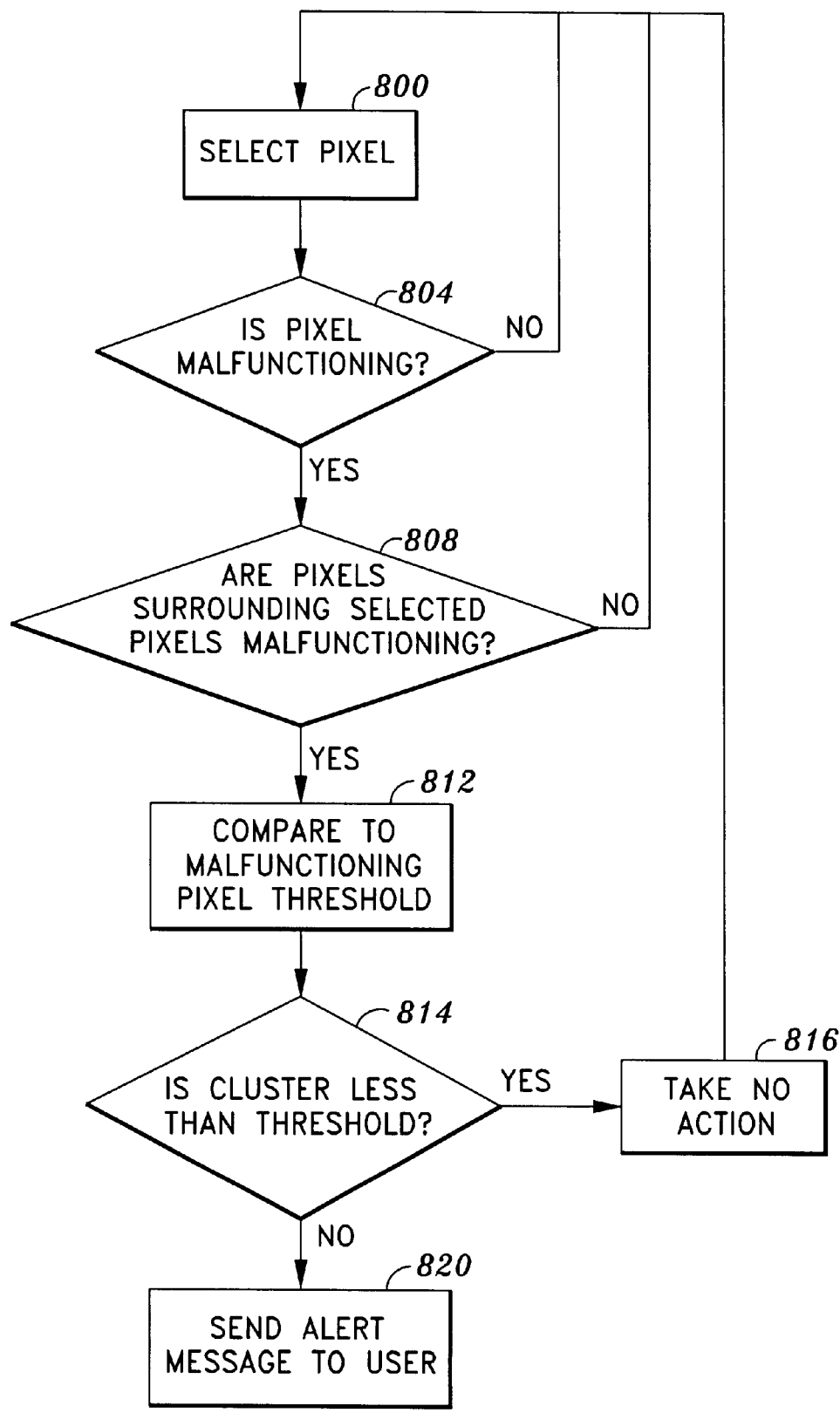
FIG. 8 is a flow chart illustrating the process of detecting a cluster of malfunctioning pixels.

The updated map is then transmitted to the computer 118 for use in processing the electrical signals. In one embodiment, if the total number of malfunctioning pixels 124 exceeds a threshold, an alert message is transmitted to the computer 118 to display to the user that the image sensor 100 is no longer functioning properly. Important information may be missed once the number of malfunctioning pixels 124 grows too large. Therefore, in this situation, even though interpolation may still provide a smooth image, the user should not use the image sensor 100. Another situation which is also preferably detected is when a number of pixels in a cluster are malfunctioning. Malfunctioning pixels in clusters may hide or mask important diagnostic information if the cluster is too large, even though the total number of malfunctioning pixels may be small. Thus, as shown in FIG. 8, the system in accordance with the present invention determines whether a malfunctioning pixel is a part of a cluster of malfunctioning pixels. First, the system selects 800 a pixel to test. Next, the system determines 804 whether the pixel is malfunctioning in accordance with the process described above. If the system determines that the pixel is malfunctioning, the system determines 808 whether the pixels surrounding the pixel are also malfunctioning. Then, the number of malfunctioning pixels surrounding the selected pixels are compared 812 to a malfunctioning cluster threshold. This threshold specifies the minimum number of pixels which can be malfunctioning and contiguous. If the system determines 814 that the number of malfunctioning pixels in the cluster is less than this threshold, then the cluster is deemed to not pose a significant source of error, and no action is taken 816. However, clusters having a number of malfunctioning pixels above this threshold are determined to warrant an alert message being sent 820 to the user. Alternatively, the updated map is compared with the last version of the pixel map stored to determine if there are any newly malfunctioning pixels 124. If there are, the user is alerted of the presence of the newly malfunctioning pixel 124. The user can also request this information from the defect discriminator 140 through initiating a request through the external monitoring computer 118.

Figure 9:
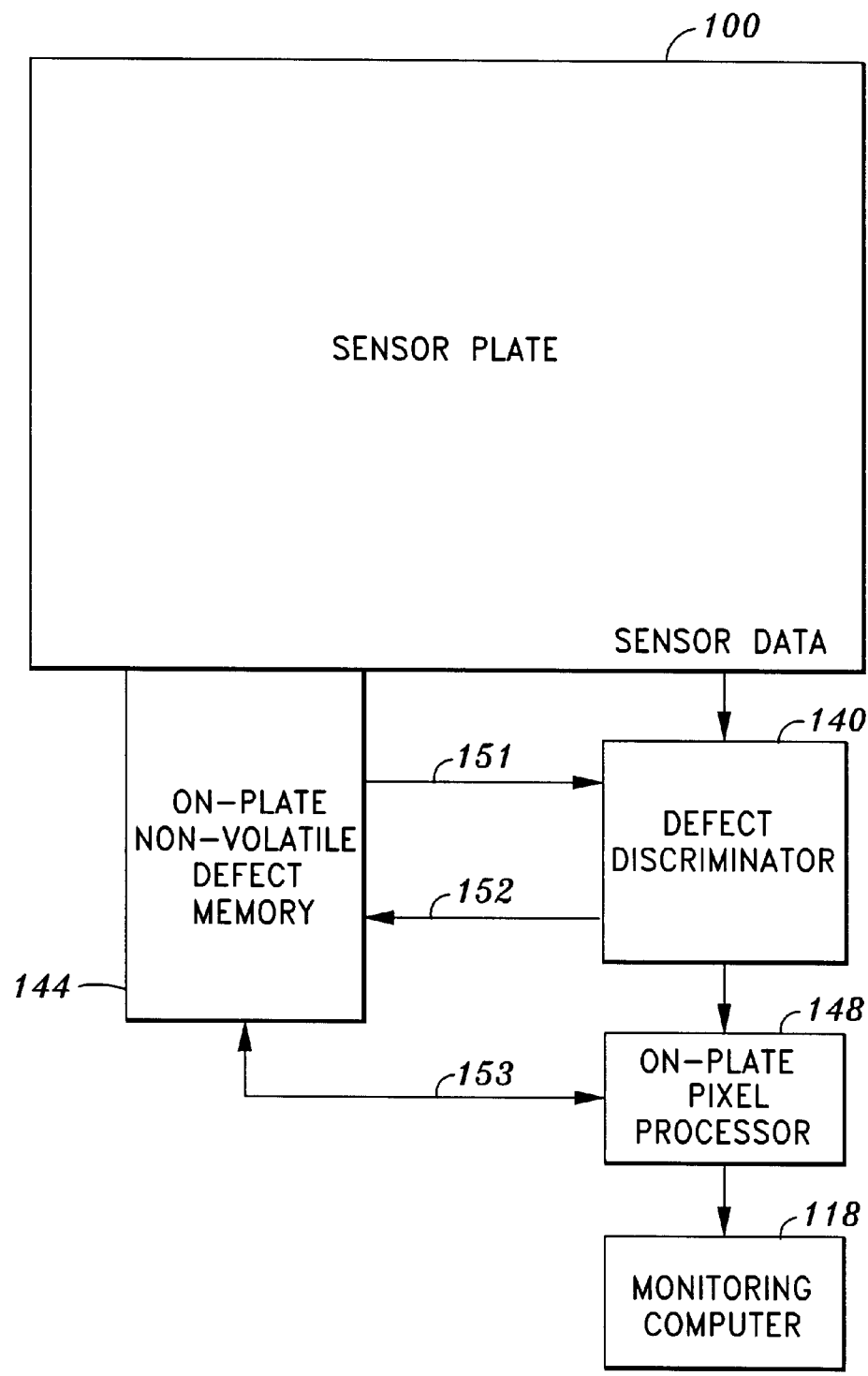
FIG. 9 is a block diagram illustrating an alternate embodiment of image sensor 100 having an on-plate pixel processor 148 in accordance with the present invention.

FIG. 9 illustrates an embodiment of the present invention in which an on-plate pixel processor 148 is coupled to the defect discriminator 140, the memory device 144, and the external monitoring computer 118. The defect discriminator 140 reads the pixel information across line 151, updates the pixel information, and transmits the updated pixel information to the memory 144 across line 152. The pixel processor 148 receives the updated map from the defect discriminator 140 along line 153, and performs the interpolation required to produce a composite image. The composite image is transmitted to the external monitoring computer 118 where the image is stored. Alternatively, the image is stored in memory 144. The external monitoring computer 118 allows the user to access the stored images for later viewing. In an alternate embodiment, the pixel processor 148 is coupled to a monitoring computer 118 which displays the images as the images are transmitted by the pixel processor 148. Thus, in this embodiment, the image plate 100 is completely independent of any outside or external processing equipment. This independence allows plates 100 to be substituted for each other without any requirement of simultaneous independent data entry, as is required in conventional systems. In addition, the defect discriminator 140 is able to detect when a sensor's performance has deteriorated to an unacceptable level, and performs this detection automatically and without the user's assistance, eliminating the need for manual calibration. If problems are found, the user is alerted immediately. Alternatively, if a user requires assurance that a plate 100 is working properly, a status of the current functioning of the pixels can be requested from the plate 100.

The above description is included to illustrate the operation of the preferred embodiments and is not meant to limit the scope of the invention. The scope of the invention is to be limited only by the following claims. From the above discussion, many variations will be apparent to one skilled in the art that would yet be encompassed by the spirit and scope of the present invention.

What is claimed is:

1. A self diagnosing sensor comprising:
   a sensor plate, comprising a plurality of pixels, for transforming light energy into electrical energy;

a memory, directly coupled to the sensor plate, for storing a map of the plurality of pixels, said map indicating whether a pixel is malfunctioning; and a defect discriminator, coupled to the plurality of pixels and to the memory, for detecting pixels whose transfer characteristics do not exceed a pre-defined minimum transfer characteristic.

2. The image sensor of claim 1, further comprising:

a computer, remotely coupled to the memory and to the plate, for creating image representations responsive to the electrical energy generated by functioning pixels, and for creating image representations responsive to malfunctioning pixels.

3. The image sensor of claim 1, wherein the image sensor further comprises a layer of phosphor for converting x-ray wavelength light into light in a visible spectrum, wherein said sensor plate converts visible light into electrical signals.

4. The image sensor of claim 1, wherein the memory stores a transfer characteristic of each pixel.

5. The image sensor of claim 4, wherein the defect discriminator updates the map stored in memory each time the discriminator performs a self-test.

6. The image sensor of claim 5, wherein the defect discriminator compares an updated version of the map with a previous version of the map, and transmits an alert message when there is any change between the two maps.

7. The image sensor of claim 5, wherein different versions of the map are stored in the memory.

8. The image sensor of claim 1, wherein the defect discriminator is coupled to an external monitoring computer, and transmits an alert to a monitoring computer in response to a number of pixels whose transfer characteristics do not exceed the pre-defined minimum transfer characteristic exceeding a threshold.

9. The image sensor of claim 8, wherein the defect discriminator transmits an alert to the monitoring computer in response to identifying a number of pixels whose transfer characteristics do not exceed the pre-defined minimum transfer characteristic and which are in a contiguous cluster exceeding a malfunctioning cluster threshold.

10. The image sensor of claim 1, wherein the defect discriminator detects malfunctioning pixels responsive to receiving an external input.

11. The image sensor of claim 1, further comprising:

an external monitoring computer, coupled to the defect discriminator, for receiving pixel transfer characteristic information, comparing transfer characteristics of pixels to default transfer characteristics, and transmitting an alert message to the defect discriminator to indicate that a malfunction has occurred.

12. The image sensor of claim 1, wherein the defect discriminator transmits status information comprising an identification of a number of pixels whose transfer characteristics do not exceed the pre-defined minimum transfer characteristic responsive to receiving a request for status information from an external monitoring system.

13. The image sensor of claim 1, further comprising a processor, coupled directly to the sensor plate, for interpolating data to account for image loss caused by malfunctioning pixels to create a composite image.

* * * * *